(12) United States Patent
Oosuka et al.

(10) Patent No.: US 10,804,203 B2
(45) Date of Patent: Oct. 13, 2020

(54) SEMICONDUCTOR DEVICE AND FABRICATION METHOD FOR THE SAME

(71) Applicant: Pannova Semic, Santa Clara, CA (US)

(72) Inventors: Tsutomu Oosuka, Toyama (JP); Hisashi Ogawa, Toyama (JP); Yoshihiro Sato, Toyama (JP)

(73) Assignee: Pannova Semic, Santa Clara, CA (US)

( * ) Notice: Subject to any disclaimer, the term of this patent is extended or adjusted under 35 U.S.C. 154(b) by 0 days.

(21) Appl. No.: 15/679,836

(22) Filed: Aug. 17, 2017

(65) Prior Publication Data

US 2017/0345760 A1 Nov. 30, 2017

Related U.S. Application Data

(60) Continuation of application No. 15/013,946, filed on Feb. 2, 2016, now Pat. No. 9,780,039, which is a (Continued)

(30) Foreign Application Priority Data

Oct. 31, 2007 (JP) ................................ 2007-282678

(51) Int. Cl.
*H01L 23/535* (2006.01)
*H01L 21/285* (2006.01)
(Continued)

(52) U.S. Cl.
CPC ...... *H01L 23/535* (2013.01); *H01L 21/28518* (2013.01); *H01L 21/28525* (2013.01); *H01L 21/76895* (2013.01); *H01L 21/823425* (2013.01); *H01L 21/823468* (2013.01); *H01L 21/823475* (2013.01); *H01L 27/11* (2013.01); *H01L 29/161* (2013.01); *H01L 29/78* (2013.01); *H01L 2924/0002* (2013.01)

(58) Field of Classification Search
CPC ............. H01L 23/535; H01L 21/28518; H01L 29/161; H01L 29/78; H01L 21/28525; H01L 21/76895; H01L 21/823425; H01L 21/823468; H01L 21/823475; H01L 27/11; H01L 2924/0002
See application file for complete search history.

(56) References Cited

U.S. PATENT DOCUMENTS

2006/0138398 A1* 6/2006 Shimamune ...... H01L 29/66628
257/19
2007/0096212 A1* 5/2007 Sato ................ H01L 21/823425
257/350

FOREIGN PATENT DOCUMENTS

JP 2003-23111 * 1/2003
JP 2007-27348 * 2/2007

* cited by examiner

*Primary Examiner* — Benjamin Tzu-Hung Liu
(74) *Attorney, Agent, or Firm* — Kunzler Bean & Adamson

(57) ABSTRACT

The semiconductor device includes: a transistor having a gate electrode formed on a semiconductor substrate and first and second source/drain regions formed in portions of the semiconductor substrate on both sides of the gate electrode; a gate interconnect formed at a position opposite to the gate electrode with respect to the first source/drain region; and a first silicon-germanium layer formed on the first source/drain region to protrude above the top surface of the semiconductor substrate. The gate interconnect and the first source/drain region are connected via a local interconnect structure that includes the first silicon-germanium layer.

37 Claims, 8 Drawing Sheets

Related U.S. Application Data continuation of application No. 13/687,407, filed on Nov. 28, 2012, now Pat. No. 9,287,392, which is a division of application No. 13/149,554, filed on May 31, 2011, now Pat. No. 8,344,455, which is a division of application No. 12/247,518, filed on Oct. 8, 2008, now Pat. No. 7,977,800.

(51) Int. Cl.
*H01L 29/161* (2006.01)
*H01L 29/78* (2006.01)
*H01L 21/768* (2006.01)
*H01L 21/8234* (2006.01)
*H01L 27/11* (2006.01)

SEMICONDUCTOR DEVICE AND FABRICATION METHOD FOR THE SAME

CROSS-REFERENCE TO RELATED APPLICATIONS

This application is a Continuation of U.S. application Ser. No. 15/013,946, filed on Feb. 2, 2016. U.S. application Ser. No. 15/013,946 is a Continuation of U.S. application Ser. No. 13/687,407, filed on Nov. 28, 2012, now U.S. Pat. No. 9,287,392, issued Mar. 15, 2016. U.S. application Ser. No. 13/687,407 is a Divisional of U.S. application Ser. No. 13/149,554, filed on May 31, 2011, now U.S. Pat. No. 8,344,455, issued Jan. 1, 2013. U.S. application Ser. No. 13/149,554 is a Divisional of U.S. application Ser. No. 12/247,518, filed on Oct. 8, 2008, now U.S. Pat. No. 7,977,800, issued Jul. 12, 2011. U.S. application Ser. No. 12/247,518 claims priority to Japanese Patent Application No. 2007-282678, filed on Oct. 31, 2007, the entire contents of each of which are hereby incorporated by reference.

BACKGROUND OF THE INVENTION

Technical Field

The present invention relates to a semiconductor device having a local interconnect structure and a fabrication method for the same.

Background Art

In recent years, with the trend toward finer semiconductor devices, gate electrodes tend to have larger contact resistance and wiring resistance. To address this problem, a local interconnect structure is used to connect a gate electrode with a source/drain region to thereby reduce wiring resistance (see Japanese Laid-Open Patent Publication No. 2007-150244, for example). The local interconnect structure as used herein refers to routing, including a shared contact plug, that connects an element and an interconnect mutually without use of global wiring formed in a wiring layer.

In particular, in a metal-insulator-semiconductor (MIS) transistor constituting a static random access memory (SRAM) cell, such a local interconnect structure is very effective because with use of the local interconnect structure, not only the reduction in wiring resistance but also reduction in the size of the SRAM cell can be attained.

FIG. 10 shows a cross-sectional configuration of a conventional semiconductor device having a shared contact. As shown in FIG. 10, an active region 107 surrounded with an isolation region 106 is formed in a semiconductor substrate 101. A MIS transistor 110 is formed in the active region 107. A gate electrode 103A of the MIS transistor 110 is formed on the active region 107 with a gate insulating film 102A interposed therebetween. Source/drain regions 104a and 104b are formed in portions of the active region 107 located on both sides of the gate electrode 103A. Sidewalls 105A are formed on both side faces of the gate electrode 103A.

A gate interconnect 103B is formed on a portion of the active region 107 located on the side of the source/drain region 104a opposite to the side thereof closer to the gate electrode 103A, with an insulating film 102B interposed therebetween. Sidewalls 105B are formed on both side faces of the gate interconnect 103B.

An underlying insulating film 120 and an interlayer insulating film 121 are formed on the semiconductor substrate 101 to cover the gate electrode 103A and the gate interconnect 103B. A shared contact plug 108 connected to both the source/drain region 104a and the gate interconnect 103B and a contact plug 109 connected to the source/drain region 104b are formed through the underlying insulating film 120 and the interlayer insulating film 121.

With the connection of the source/drain region 104a with the gate interconnect 103B via the shared contact plug 108, it is possible to not only reduce wiring resistance but also reduce the occupation area, compared with a configuration in which contacts are separately formed for the source/drain region 104a and the gate interconnect 103B and are connected to each other in a wiring layer. Hence, semiconductor devices adopting a local interconnect structure such as the shared contact plug can be downsized without increasing wiring resistance.

SUMMARY OF THE INVENTION

However, the conventional semiconductor device has the following problem. To form a shared contact plug, it is necessary to form an opening (contact hole) that exposes the top surfaces of the source/drain region and the gate interconnect through the interlayer insulating film. The contact hole for the shared contact plug is therefore considerably larger than a contact hole for forming a normal contact plug. When such contact holes having considerably different sizes are formed by dry etching, there arises a difference in etched dimension (etching critical dimension) according to the difference in opening area, and this makes it difficult to control the dimensions of the shared contact plug and the normal contact plug (see Y. Kimura et al, Optimization of contact formation process for 45 nm technology node Ultra High Density SRAM", Extended Abstracts of the 54th Meeting, Japan Society of Applied Physics, 2007, p. 931, for example). Hence, to secure the alignment margin between the shared contact plug and the source/drain region, the area of the source/drain region must be increased. This raises a problem of increasing the size of the resultant semiconductor device.

An object of the present invention is providing a semiconductor device having a local interconnect structure involving no increase in the size of source/drain regions.

To attain the above object, according to the present invention, a semiconductor device is configured to have a local interconnect structure that has a SiGe layer formed on a source/drain region to protrude above the top surface of a semiconductor substrate.

Specifically, the semiconductor device of the present invention includes: a transistor having a gate electrode formed on a semiconductor substrate and first and second source/drain regions formed in portions of the semiconductor substrate located on the sides of the gate electrode; a gate interconnect formed at a position opposite to the gate electrode with respect to the first source/drain region; a first silicon-germanium layer formed on the first source/drain region to protrude above the top surface of the semiconductor substrate; and a first contact plug connected to the first silicon-germanium layer, wherein the gate interconnect and the first source/drain region are connected via a local interconnect structure including the first silicon-germanium layer.

In the semiconductor device of the present invention, the aspect ratio of the contact hole can be reduced compared with the case of forming a contact plug directly connected to both the source/drain region and the gate interconnect. This improves the precision of formation of the contact hole, and thus makes it unnecessary to increase the size of the source/ drain region. As a result, a downsized semiconductor device having a low-resistance local interconnect structure can be implemented.

The first fabrication method for a semiconductor device of the present invention includes the steps of: (a) forming a gate electrode and a gate interconnect spaced from each other on a semiconductor substrate; (b) forming a first source/drain region and a second source/drain region in portions of the semiconductor substrate located on a side of the gate electrode closer to the gate interconnect and on the opposite side of the gate electrode, respectively; (c) forming a first silicon-germanium layer to extend over the top surfaces of the first source drain region and the gate interconnect; (d) forming an interlayer insulating film on the semiconductor substrate after the step (c); and (e) forming a first contact plug through the interlayer insulating film to be connected to the first silicon-germanium layer.

In the first fabrication method for a semiconductor device, the first source/drain region and the conductive film are electrically connected with each other via the SiGe layer. This can reduce the wiring resistance between the first source/drain region and the conductive film. Also, since the contact plug can only be in contact with the SiGe layer, it is unnecessary to provide a shared contact plug. Hence, the aspect ratio of the contact hole can be reduced, and thus the contact hole can be formed with high precision. It is therefore unnecessary to increase the size of the first source/drain region. As a result, a downsized semiconductor device with low wiring resistance can be fabricated.

The second fabrication method for a semiconductor device of the present invention includes the steps of: (a) forming a gate electrode and a gate interconnect spaced from each other on a semiconductor substrate; (b) forming a first source/drain region and a second source/drain region in portions of the semiconductor substrate located on a side of the gate electrode closer to the gate interconnect and on the opposite side of the gate electrode, respectively; (c) forming a first silicon-germanium layer on the first source drain region to protrude above the top surface of the semiconductor substrate; (d) forming an interlayer insulating film on the semiconductor substrate after the step (c); and (e) forming a shared contact plug through the interlayer insulating film to be connected to part of the first silicon-germanium layer and part of the gate interconnect.

In the second fabrication method for a semiconductor device, the aspect ratio of the contact hole for formation of the shared contact plug can be reduced. Hence, the contact hole can be formed with high precision, and this makes it unnecessary to increase the size of the first source/drain region. As a result, a downsized semiconductor device with low wiring resistance can be fabricated.

DESCRIPTION OF THE PREFERRED EMBODIMENTS

Embodiment 1

Figure 1:
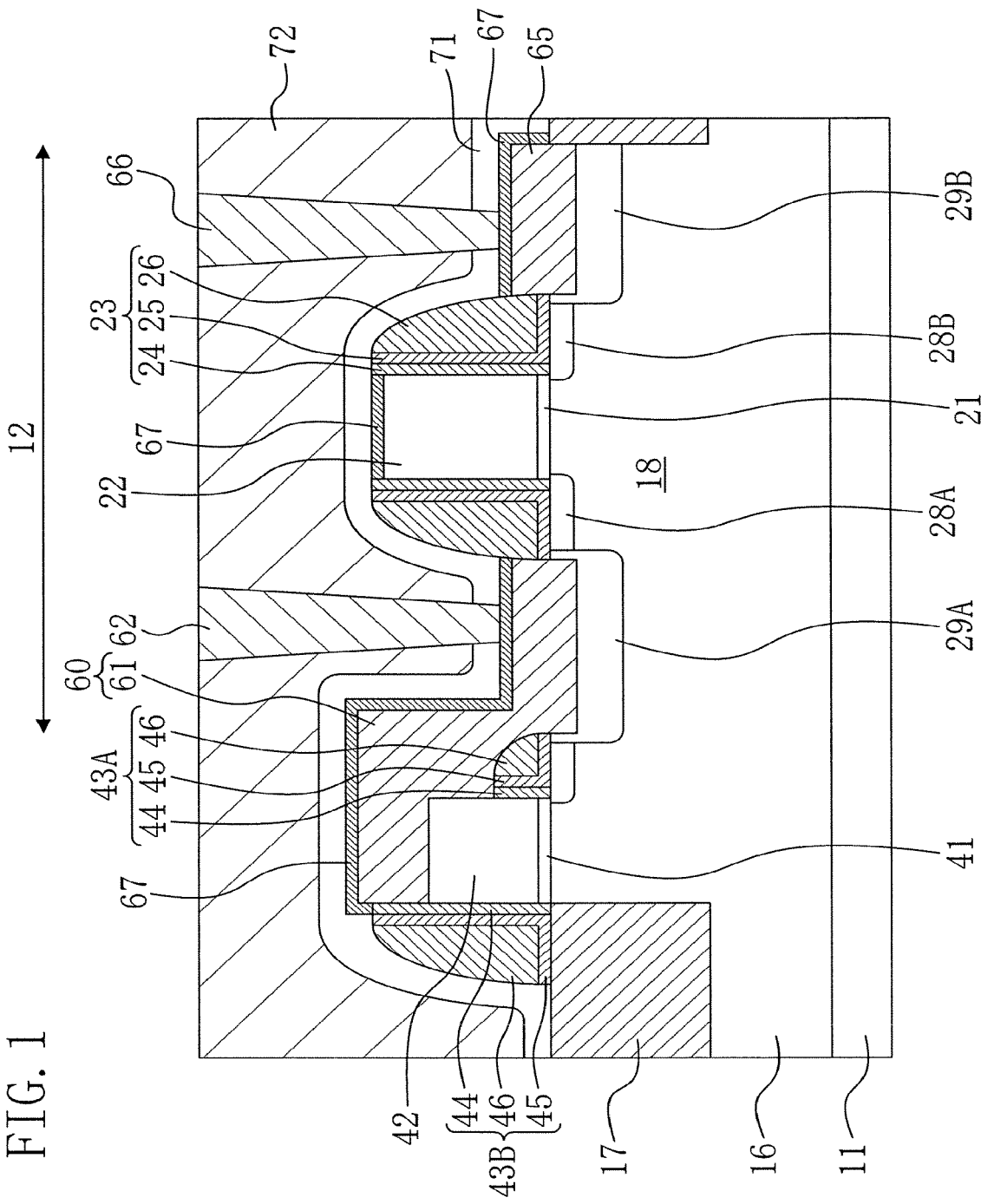
FIG. 1 is a cross-sectional view of a semiconductor device of Embodiment 1 of the present invention.

FIG. 1 shows a cross-sectional configuration of a semiconductor device of Embodiment 1 of the present invention. As shown in FIG. 1, the semiconductor device of this embodiment has a local interconnect structure 60 composed of a SiGe layer 61 formed to extend over the top surfaces of a first source/drain region 29A, a sidewall 43A and a gate interconnect 42.

As shown in FIG. 1, an n-type well 16 is formed in a semiconductor substrate 11 made of silicon (Si), and an active region 18 surrounded with an isolation region 17 is formed in the n-type well 16. A p-type MIS transistor 12 is formed in the active region 18.

The MIS transistor 12 includes a gate electrode 22 formed on the active region 18 with a gate insulating film 21 interposed therebetween and sidewalls 23 formed on both side faces of the gate electrode 22. Each of the sidewalls 23 has an offset sidewall 24 having a plate-shaped cross-section, an inner sidewall 25 having an L-shaped cross-section and an outer sidewall 26 covering the inner sidewall 25.

P-type extension regions 28A and 28B are formed in portions of the active region 18 located on both sides of the gate electrode 22. First and second p-type source/drain regions 29A and 29B, having depressions in their top portions, are formed in portions of the active region 18 located outside of the respective sidewalls 23.

A gate interconnect 42 is formed on the active region 18, with an insulating film 41 interposed therebetween, at a position opposite to the gate electrode 22 with respect to the first source/drain region 29A. A sidewall 43A is formed on one of the side faces of the gate interconnect 42 closer to the first source/drain region 29A, and a sidewall 43B is formed on the other side face of the gate interconnect 42. The sidewall 43A is lower in height than the sidewall 43B, with part of the side face of the gate interconnect 42 closer to the first source/drain region 29A being left uncovered with the sidewall 43A.

Each of the sidewalls 43A and 43B has an offset sidewall 44 having a plate-shaped cross-section, an inner sidewall 45 having an L-shaped cross-section and an outer sidewall 46 covering the inner sidewall 45.

The first source/drain region 29A and the gate interconnect 42 are electrically connected to each other via the silicon-germanium (SiGe) layer 61 that constitutes the local interconnect structure 60. This can reduce the wiring resistance between the first source/drain region 29A and the gate interconnect 42. A contact plug 62 is formed on the portion of the SiGe layer 61 that buries the depression on the first source/drain region 29A via a silicide layer 67. Likewise, a contact plug 66 is formed on the portion of a SiGe layer 65 that buries the depression on the second source/drain region 29B via the silicide layer 67. The contact plugs 62 and 66 are formed through an underlying insulating film 71 and an interlayer insulating film 72 formed sequentially to cover the gate electrode 22, the gate interconnect 42 and the SiGe layers 61 and 65.

In the semiconductor device of this embodiment, as shown in FIG. 1, the SiGe layer 61 is used as the local interconnect structure 60 for connecting the first source/drain region 29A with the gate interconnect 42. Hence, the contact plug 62 reaching the silicide layer 67 on the SiGe layer 61 is not required to be large, but can be of the same size as the contact plug 66 reaching the silicide layer 67 on the SiGe layer 65. In formation of the contact holes through the underlying insulating film 71 and the interlayer insulating layer 72, therefore, there will arise no etching critical dimension according to the difference in opening area. Thus, the dimensions of the contact plugs 62 and 66 can be easily controlled without the necessity of increasing the size of the first source/drain region 29A. As a result, the semiconductor device can be downsized.

The SiGe layers 61 and 65 are formed to bury the depressions in the top portions of the first and second source/drain regions 29A and 29B. With these SiGe layers, compressive stress in the gate length direction is applied to the channel region of the MIS transistor 12. This improves the mobility of hole carriers, and thus can improve the driving force of the p-type MIS transistor.

In this embodiment, the top portions of the SiGe layers 61 and 65 and the gate electrode 22 are silicified to form the silicide layer 67. The contact plugs 62 and 66 are therefore in contact with the SiGe layers 61 and 65 via the silicide layer 67. This can further reduce the wiring resistance.

Figure 2A:
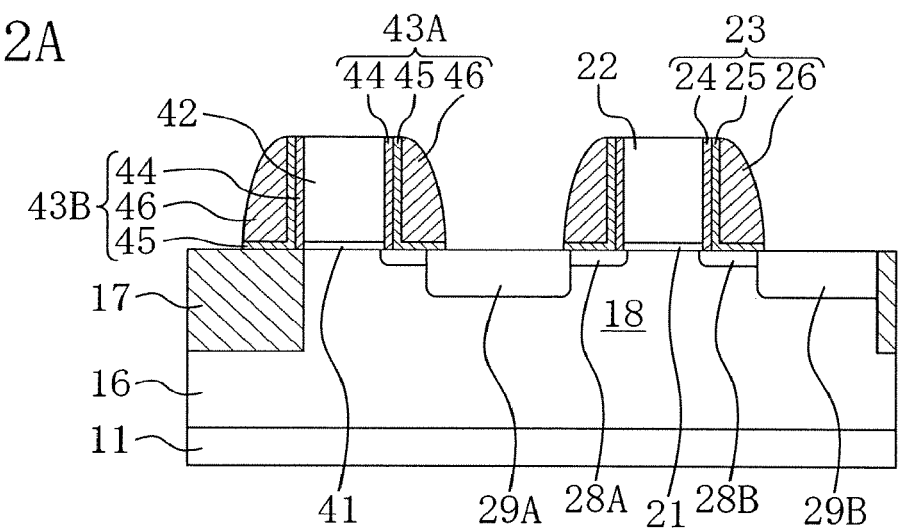
FIGS. 2A to 2C are cross-sectional views sequentially illustrating process steps of a fabrication method for the semiconductor device of Embodiment 1 of the present invention.

Hereinafter, a fabrication method for the semiconductor device of Embodiment 1 will be described with reference to FIGS. 2A to 2C, 3A to 3C, 4A, 4B and 5. First, as shown in FIG. 2A, an isolation region 17 is formed in the semiconductor substrate 11 made of Si, to define the active region 18 surrounded with the isolation region 17. N-type impurity ions are implanted in the semiconductor substrate 11 to form the n-type well 16. Subsequently, an insulating film made of $SiO_2$ and the like having a thickness of about 2 nm and a polysilicon film having a thickness of about 100 nm are sequentially formed on the semiconductor substrate 11. The polysilicon film and the insulating film are then selectively etched, to form the gate insulating film 21 and the gate electrode 22 on the active region 18, and also the insulating film 41 and the gate interconnect 42 at a position on the active region 18 spaced from the gate electrode 22. Note that the insulating film 41 and the gate interconnect 42 are not necessarily formed on the active region 18 but may be formed on the isolation region 17. A resist mask or a hard mask may be used as an etching mask for the polysilicon film and the insulating film.

Thereafter, an insulating film made of $SiO_2$ and the like is formed on the semiconductor substrate 11 and then etched back, to form the offset sidewalls 24 and 44 on the side faces of the gate electrode 22 and gate interconnect 42, respectively.

Using the gate electrode 22 and the offset sidewalls 24 as a mask, a p-type impurity is implanted in the active region 18 to form the p-type extension regions 28A and 28B as shallow source/drain regions.

Subsequently, a silicon oxide film and a silicon nitride film are sequentially deposited on the semiconductor substrate 11 and then etched back. This results in formation of the inner sidewalls 25 made of the silicon oxide film and the outer sidewalls 26 made of the silicon nitride film on both side faces of the gate electrode 22 via the offset sidewalls 24, as well as formation of the inner sidewalls 45 made of the silicon oxide film and the outer sidewalls 46 made of the silicon nitride film on both side faces of the gate interconnect 42 via the offset sidewalls 44. Hence, the sidewalls 23 are formed on both side faces of the gate electrode 22, the sidewall 43A is formed on the side face of the gate interconnect 42 closer to the gate electrode 22, and the sidewall 43B is formed on the other side face of the gate interconnect 42.

A p-type impurity is then implanted in the active region 18 using the gate electrode 22 and the sidewalls 23 as a mask, to form the p-type first and second source/drain regions 29A and 29B as deep source/drain regions in portions of the active region 18 located outside of the sidewalls 23.

Figure 2B:
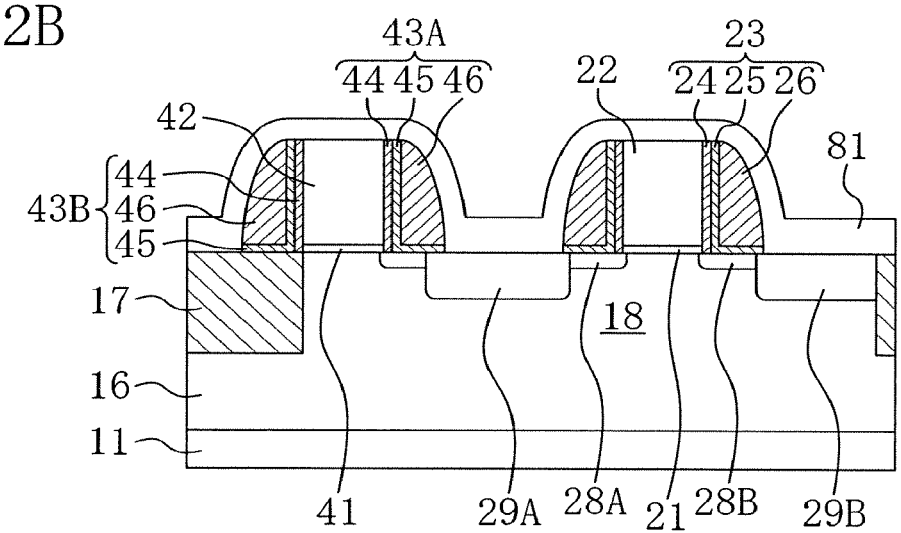

As shown in FIG. 2B, a protection film 81 made of $SiO_2$ and the like having a thickness of about 50 nm is formed on the entire surface of the semiconductor substrate 11.

Figure 2C:
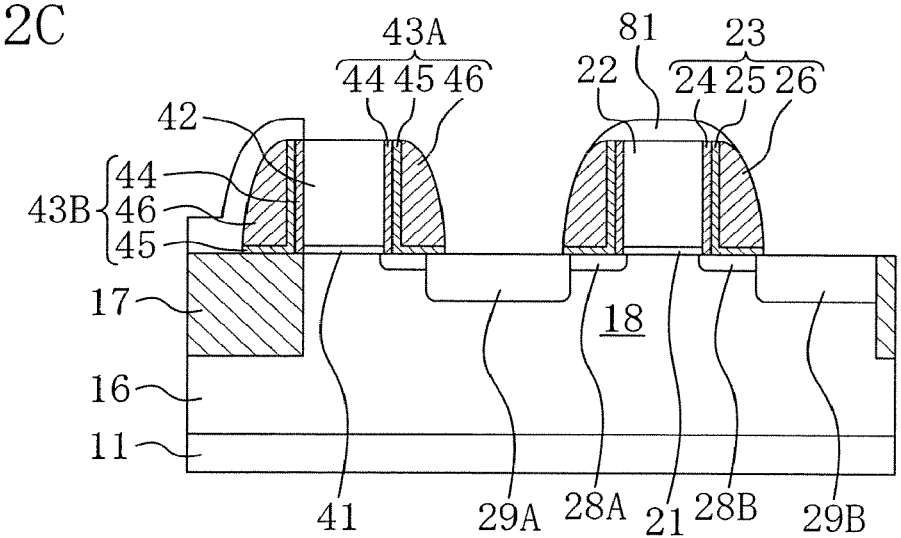

As shown in FIG. 2C, the protection film 81 is partly removed to expose the first and second source/drain regions 29A and 29B, the gate interconnect 42 and the sidewall 43A, while being left unremoved on the gate electrode 22 not to expose the top surface of the gate electrode 22.

Figure 3A:
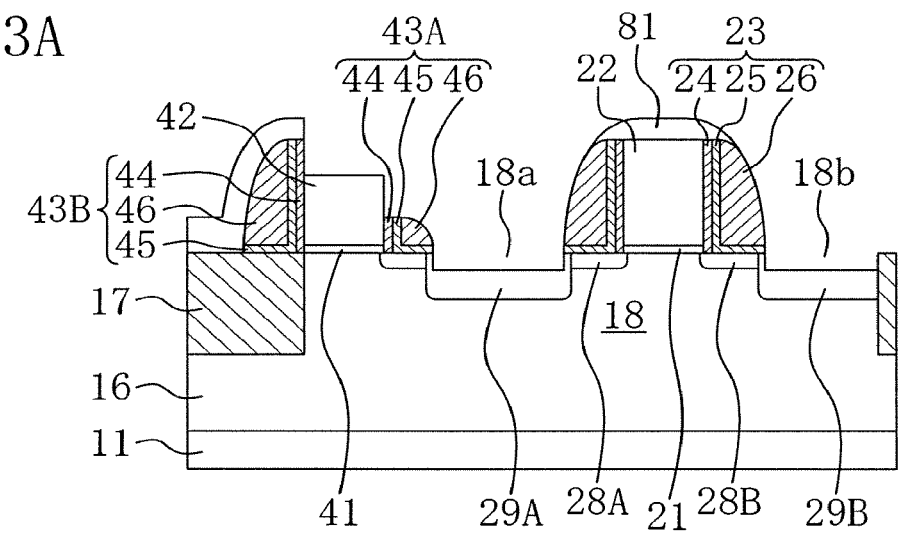
FIGS. 3A to 3C are cross-sectional views sequentially illustrating process steps of the fabrication method for the semiconductor device of Embodiment 1 of the present invention.

As shown in FIG. 3A, using the protection film 81 and the sidewalls 23 as a mask, the semiconductor substrate 11 is etched, to form depressions 18a and 18b having a depth of about 40 nm on the portions of the active region 18 where the first and second source/drain regions 29A and 29B are formed. Simultaneously, the gate interconnect 42 is etched at its top portion, to become lower in height than the gate electrode 22 and the sidewall 43B. The sidewall 43A is also etched to become lower in height than the sidewall 43B. The sidewall 43A is further etched selectively to expose the upper part of the side face of the gate interconnect 42 closer to the gate electrode 22. The etching may be made by dry etching, wet etching using an organic alkaline etchant or a combined method thereof.

Figure 3B:
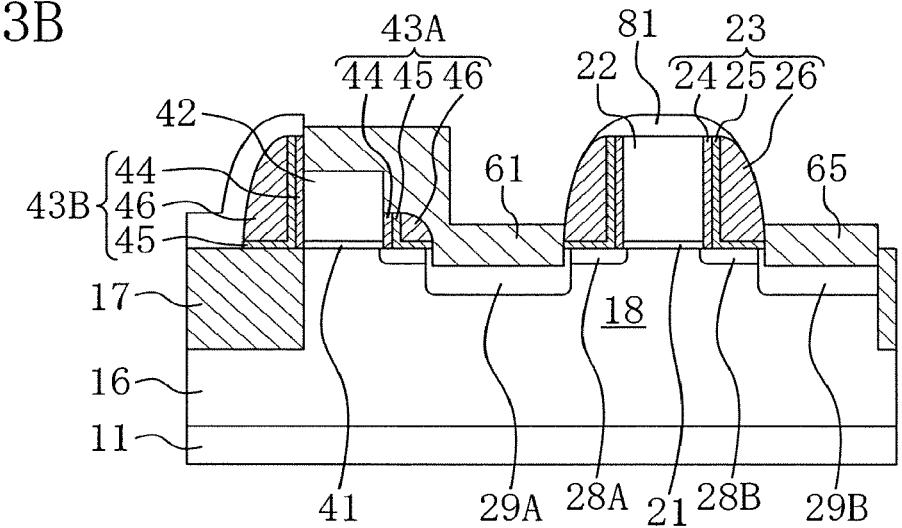

As shown in FIG. 3B, a p-type SiGe layer is epitaxially grown on the top surface of the gate interconnect 42, the side face of the gate interconnect 42, the top surface of the first source/drain region 29A and the top surface of the second source/drain region 29B, on all of which Si is exposed. In this way, the SiGe layer 61 is formed to extend over the top surfaces of the first source/drain region 29A and the gate interconnect 42, and the SiGe layer 65 is formed on the second source/drain region 29B. The first source/drain region 29A and the gate interconnect 42 are therefore electrically connected with each other. The portion of the SiGe layer 61 located on the first source/drain region 29A and the SiGe layer 65 respectively bury the depressions 18a and 18b and protrude above the top surface of the semiconductor substrate 11. The SiGe layers 61 and 65 may be formed by low-pressure chemical vapor deposition (low-pressure CVD) using silane gas ($SiH_4$), germane gas ($GeH_4$) and a p-type dopant such as diborane ($B_2H_6$).

Figure 3C:
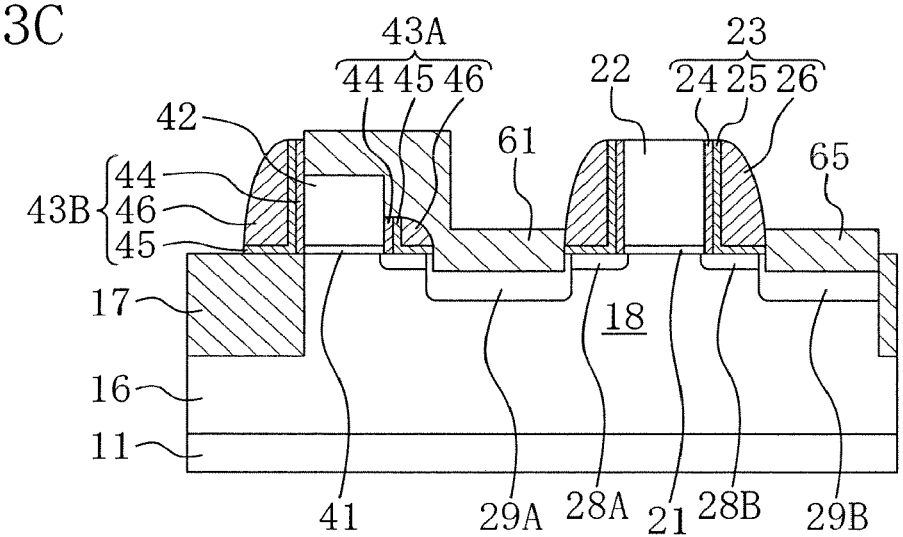

As shown in FIG. 3C, the protection film 81 is selectively removed.

Figure 4A:
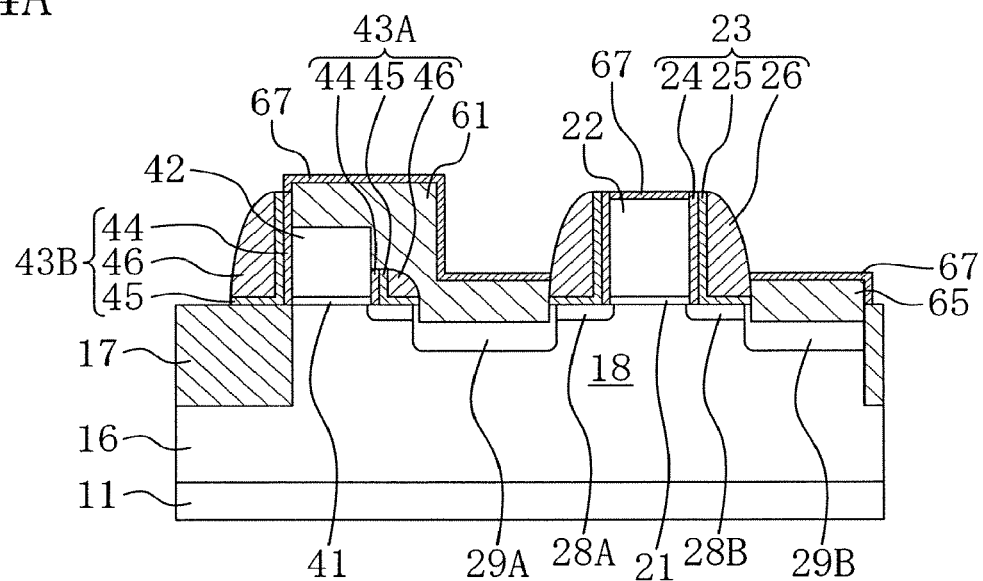
FIGS. 4A and 4B are cross-sectional views sequentially illustrating process steps of the fabrication method for the semiconductor device of Embodiment 1 of the present invention.

As shown in FIG. 4A, a metal film having a high melting point such as nickel (Ni) is deposited on the semiconductor substrate 11 to a thickness of several nanometers and then heat-treated, to silicify the top portions of the SiGe layers 61 and 65, the gate interconnect 42 and the gate electrode 22, to thereby form the silicide layer 67. The unreacted remainder of the metal film is then removed.

Figure 4B:
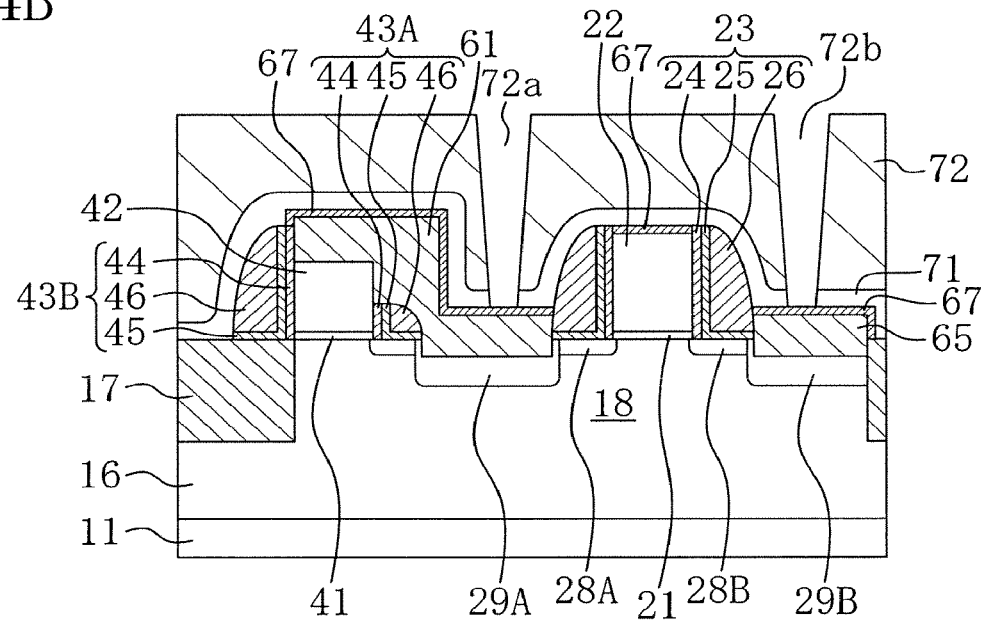

As shown in FIG. 4B, the underlying insulating film 71 made of silicon nitride is formed on the entire surface of the semiconductor substrate 11, and then the interlayer insulating film 72 made of silicon oxide is formed on the underlying insulating film 71. Thereafter, a contact hole 72a and a contact hole 72b are formed through the interlayer insulating film 72 and the underlying insulating film 71 to reach the portion of the silicide layer 67 on the SiGe layer 61 and the portion thereof on the SiGe layer 65, respectively. Note that the contact hole 72a may be formed at any position as long as it reaches the silicide film 67 on the SiGe layer 61. Hence, in place of the position above the first source/drain region 29A as in the illustrated example, the contact hole 72a may be formed at a position above the gate interconnect 42, for example.

Figure 5:
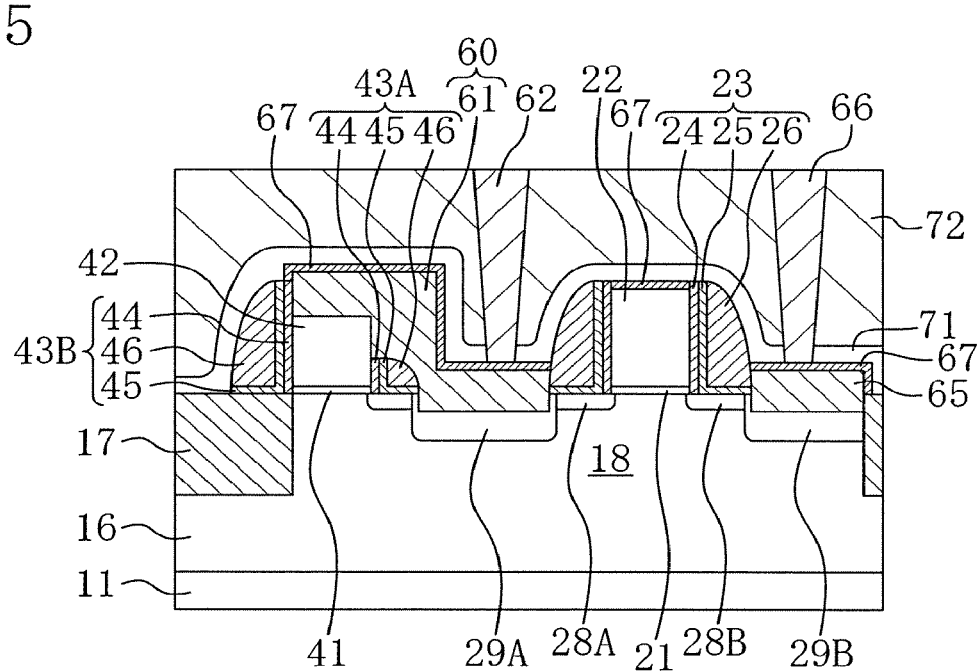
FIG. 5 is a cross-sectional view illustrating a process step of the fabrication method for the semiconductor device of Embodiment 1 of the present invention.

As shown in FIG. 5, the contact holes 72a and 72b are buried with a conductive material such as tungsten, to form the contact plug 62 connected to the SiGe layer 61 via the silicide layer 67 and the contact plug 66 connected to the SiGe layer 65 via the silicide layer 67.

Figure 10:
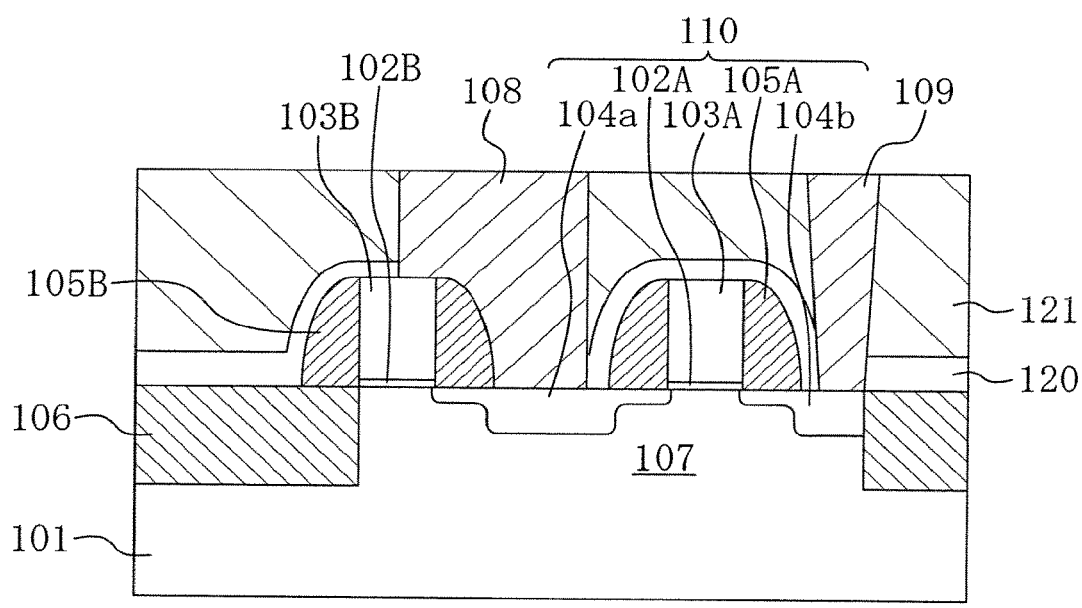
FIG. 10 is a cross-sectional view of a conventional semiconductor device.

In the fabrication method for the semiconductor device of this embodiment, the SiGe layer 61 is used as the local interconnect structure for connecting the first source/drain region 29A with the gate interconnect 42. Hence, unlike the local interconnect structure made of the conventional shared contact 108 as shown in FIG. 10, it is unnecessary to form a large contact hole. In other words, in this embodiment, in which the first source/drain region 29A and the gate interconnect 42 are connected with each other via the SiGe layer 61, the contact hole 72a reaching the silicide layer 67 on the SiGe layer 61 is not required to be large, but can be of the same size as the contact hole 72b reaching the silicide layer 67 on the SiGe layer 65. Accordingly, with no etching critical dimension occurring according to the difference in contact hole opening area, the contact holes can be formed with high precision. This makes it possible to reduce the size of the first source/drain region 29A, and thus the semiconductor device can be downsized. In the configuration of connecting the contact hole 72a to the SiGe layer 61 at a position above the gate interconnect 42, also, the contact hole 72a can be of the same size as the contact hole 72b. The contact holes can therefore be formed with high precision.

Also, in the fabrication method for the semiconductor device of this embodiment, the sidewall 43A is made short to expose part of the side face of the gate interconnect 42 closer to the first source/drain region 29A. The SiGe layer 61 therefore grows also on the side face of the gate interconnect 42, and this ensures the connection between the SiGe layer grown on the first source/drain region 29A and the SiGe layer grown on the gate interconnect 42. Note that it is not necessarily required to expose the side face of the gate interconnect 42 closer to the first source/drain region 29A if only the SiGe layer 61 can be formed to extend over the top surfaces of the first source/drain region 29A and the gate interconnect 42.

In this embodiment, the depressions 18a and 18b were formed on the first and second source/drain regions 29A and 29B, and the SiGe layers 61 and 65 were formed to bury the depressions 18a and 18b. With this formation, compressive stress in the gate length direction is applied to the channel region of the MIS transistor, and this improves the driving force of the p-type MIS transistor. If such an effect of improving the driving force is unnecessary, the depressions 18a and 18b may not be formed. If no such depressions are formed, the SiGe layer 65 may not be formed on the second source/drain region 29B. Like the p-type MIS transistor, an n-type MIS transistor may be formed in a similar manner. In this case, it is unnecessary to form depressions on the source/drain regions.

Embodiment 2

Figure 6:
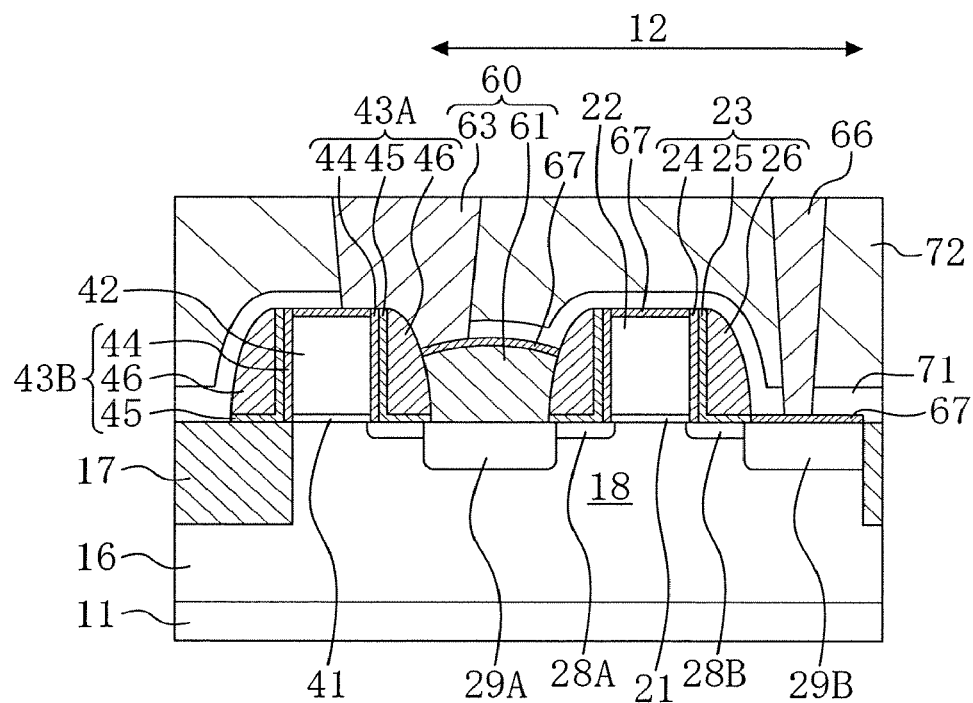
FIG. 6 is a cross-sectional view of a semiconductor device of Embodiment 2 of the present invention.

Embodiment 2 of the present invention will be described with reference to the relevant drawings. FIG. 6 shows a cross-sectional configuration of a semiconductor device of Embodiment 2. In FIG. 6, the same components as those in FIG. 1 are denoted by the same reference numerals, and the description thereof is omitted here.

As shown in FIG. 6, the semiconductor device of this embodiment has a local interconnect structure 60 composed of a SiGe layer 61 formed on a first source/drain region 29A and a shared contact plug 63 connected to part of the SiGe layer 61 and part of a gate interconnect 42.

In this embodiment, the shared contact plug 63 is greater in size than a contact plug 66. However, with the SiGe layer 61 protruding from the top surface of the semiconductor substrate 11, the aspect ratio of the contact hole for formation of the shared contact plug 63 can be reduced. The requirements of etching precision of the contact hole can therefore be widely eased. Hence, it is unnecessary to increase the size of the first source/drain region 29A, and thus the semiconductor device can be downsized.

Hereinafter, a fabrication method for the semiconductor device of Embodiment 2 will be described with reference to FIGS. 7A, 7B, 8A and 8B. The process steps up to the formation of the first and second source/drain regions 29A and 29B are the same as those in Embodiment 1, and thus description thereof is omitted here.

Figure 7A:
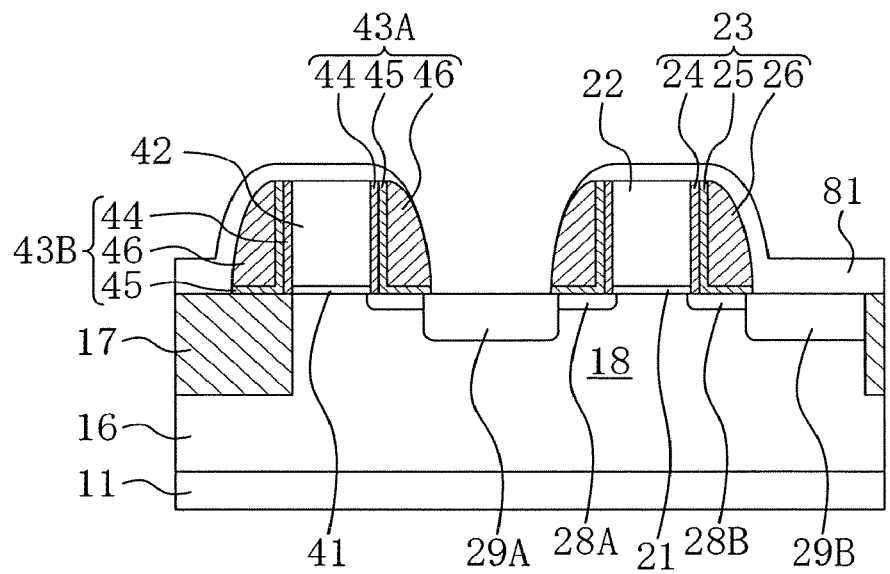
FIGS. 7A and 7B are cross-sectional views sequentially illustrating process steps of a fabrication method for the semiconductor device of Embodiment 2 of the present invention.

As shown in FIG. 7A, after the formation of the first and second source/drain regions 29A and 29B, a protection film 81 made of $SiO_2$ and the like is formed on the entire surface of the semiconductor substrate 11, and then the portion thereof overlying the first source/drain region 29A is removed. The protection film 81 is therefore left behind covering the gate electrode 22, the gate interconnect 42 and the second source/drain region 29B.

Figure 7B:
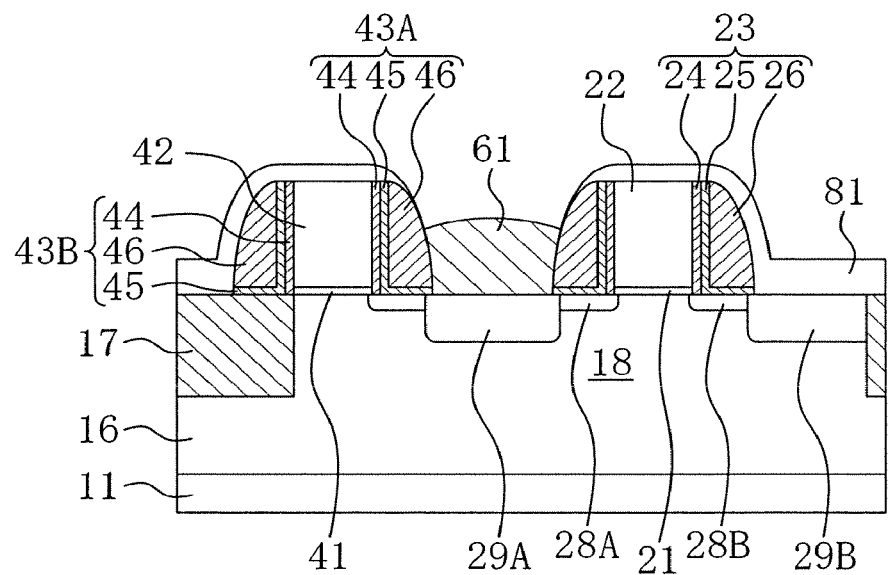

As shown in FIG. 7B, the SiGe film 61 is epitaxially grown on the top surface of the first source/drain region 29A on which Si is exposed, to obtain the SiGe film 61 protruding from the semiconductor substrate 11.

Figure 8A:
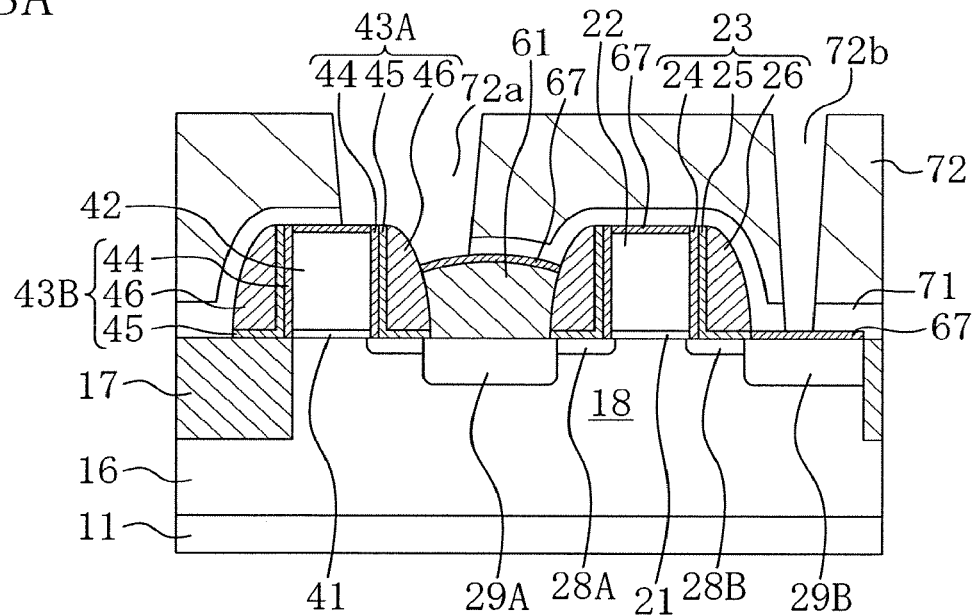
FIGS. 8A and 8B are cross-sectional views sequentially illustrating process steps of the fabrication method for the semiconductor device of Embodiment 2 of the present invention.

As shown in FIG. 8A, after selective removal of the protection film 81, a metal film having a high melting point such as nickel (Ni) is deposited on the semiconductor substrate 11 to a thickness of several nanometers and then heat-treated, to silicify the top portions of the SiGe layer 61, the gate electrode 22, the gate interconnect 42 and the second source/drain region 29B, to form a silicide layer 67. After removal of the unreacted remainder of the metal film, an underlying insulating film 71 made of a silicon nitride film is formed on the entire surface of the semiconductor substrate 11, and then an interlayer insulating film 72 made of a silicon oxide film is formed on the underlying insulating film 71. Subsequently, a contact hole 72a and a contact hole 72b are formed through the interlayer insulating film 72 and the underlying insulating film 71, to reach the portions of the silicide layer 67 on the SiGe layer 61 and the gate interconnect 42 and to reach the portion of the silicide layer 67 on the second source/drain region 29B, respectively. In this relation, the sidewall 43A exposed in the contact hole 72a may be etched selectively to make the sidewall 43A lower in height than the gate interconnect 42 to thereby expose part of the side face of the gate interconnect 42 closer to the gate electrode 22.

Figure 8B:
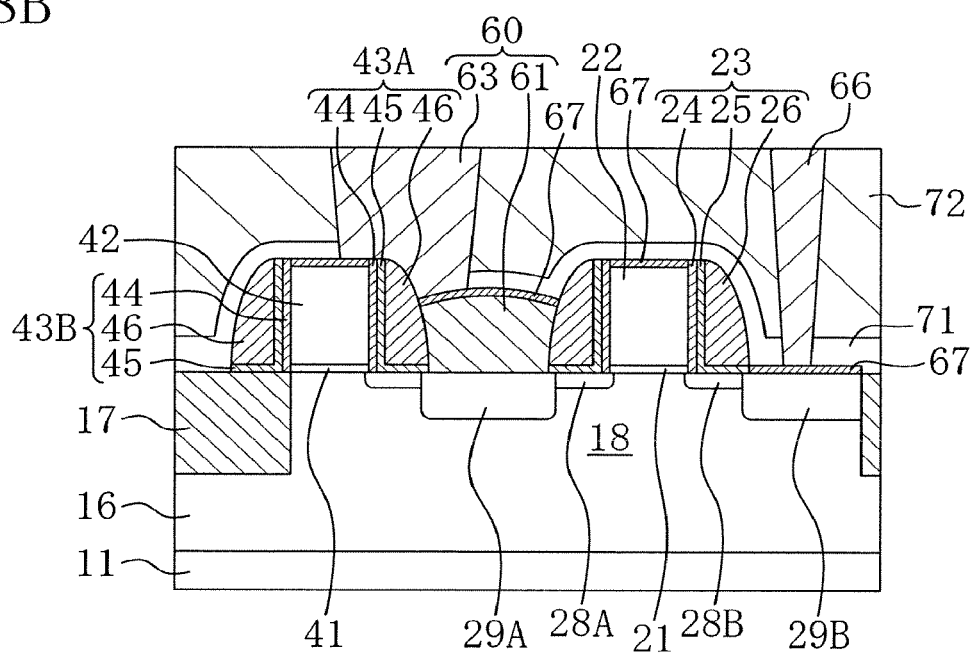

As shown in FIG. 8B, the contact holes 72a and 72b are buried with a conductive material such as tungsten, to form the shared contact plug 63 connected to the SiGe layer 61 and the gate interconnect 42 via the silicide layer 67 and the contact plug 66 connected to the second source/drain region 29B via the silicide layer 67.

In this embodiment, no SiGe layer is formed on the second source/drain region 29B. Alternatively, a SiGe layer may be formed on the second source/drain region 29B. Also, as in Embodiment 1, depressions may be formed in the top portions of the first and second source/drain regions 29A and 29B. In this case, however, the top surface of the SiGe layer 61 formed on the first source/drain region 29A should protrude above the top surface of the semiconductor substrate 11 sufficiently to ensure that the aspect ratio of the contact hole 72a is not large.

Alteration to Embodiment 2

Figure 9:
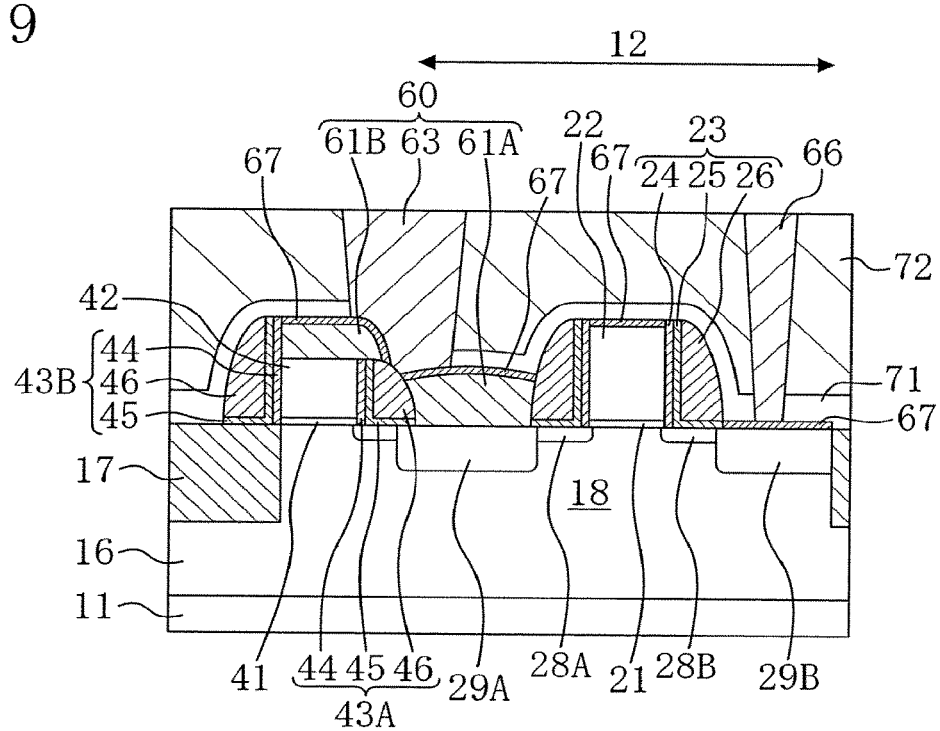
FIG. 9 is a cross-sectional view of a semiconductor device of an alteration to Embodiment 2 of the present invention.

An alteration to Embodiment 2 of the present invention will be described with reference to the relevant drawings. FIG. 9 shows a cross-sectional configuration of a semiconductor device of an alteration to Embodiment 2 of the present invention. As shown in FIG. 9, the semiconductor device of this alteration has a local interconnect structure 60 composed of a first SiGe layer 61A formed on the first source/drain region 29A, a second SiGe layer 61B formed on the gate interconnect 42 and a shared contact plug 63 connected to part of the first SiGe layer 61A and part of the second SiGe layer 61B.

With the above configuration, the second SiGe layer 61B on the gate interconnect 42 extends toward the sidewall 43A, narrowing the space between the first and second SiGe layers 61A and 61B. Hence, the contact hole for the shared contact plug 63 can be made small compared with the configuration without the second SiGe layer 61B.

In this alteration, also, the SiGe layer may be formed also on the second source/drain region 29B, and depressions may be formed in the top portions of the first and second source/drain regions 29A and 29B, as in Embodiment 1. Also, in this alteration, although the gate interconnect 42 and the sidewall 43A are the same in height, the sidewall 43A may be made lower in height than the gate interconnect 42 to expose part of the side face of the gate interconnect 42 closer to the gate electrode 22.

The semiconductor devices of the above embodiments and alteration respectively have a contact plug electrically connected to the second source/drain region. Such a contact plug connected to the second source/drain region is not necessarily required. Also, a contact plug connected to the gate electrode may be provided.

In the above embodiments and alteration, the SiGe layer was formed after formation of the source/drain regions. Alternatively, the source/drain regions may be formed by ion implantation after formation of the SiGe layer. $SiO_2$ was used as the material of the gate insulating film. Alternatively, a film having a high dielectric constant (high-K film) made of hafnium dioxide ($HfO_2$), a hafnium silicate ($HfSiO_x$ (x>1)) or the like, in place of $SiO_2$, may be used.

In the above embodiments and alteration, part of the gate interconnect was formed on the active region. Alternatively, the entire of the gate interconnect may be formed on the isolation region, or on the active region.

The semiconductor devices of the above embodiments and alteration can be used for a MIS transistor constituting part of a SRAM cell, or may be applied to a MIS transistor constituting part of another circuit section such as a logic section. Otherwise the inventive semiconductor devices can be used for devices other than memory.

As described above, according to the present invention, a semiconductor device provided with a local interconnect structure involving no increase in the size of source/drain regions can be implemented, and thus the present invention is useful as a semiconductor device having a local interconnect structure and a fabrication method for such a semiconductor device.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A semiconductor device comprising:
   a gate electrode formed on an active region of a semiconductor substrate;
   a first silicon-germanium layer formed in a first depression provided in a portion of the active region;
   the first silicon-germanium layer comprising silicon and germanium;
   a gate interconnect formed at a position opposite to the gate electrode with respect to the first depression;
   a first contact plug comprised of tungsten;
   a first sidewall formed on the side face of the gate interconnect closer to the first depression;
   a second sidewall formed on the other side face of the gate interconnect;
   the bottom surface of the first contact plug is not lower than the bottom surface of the first sidewall and the bottom surface of the first contact plug is not lower than the bottom surface of the second sidewall;
   wherein, in a cross-sectional configuration, the first sidewall is lower in height than the second sidewall, the gate interconnect is formed at least partly on the active region, and the first contact plug is electrically connected to the first silicon-germanium layer and the gate interconnect.

2. The semiconductor device of claim 1, wherein, in the cross-sectional configuration, at least a portion of the first silicon-germanium layer protrudes above the top surface of the semiconductor substrate.

3. The semiconductor device of claim 2, wherein the first contact plug does not contact the second sidewall.

4. The semiconductor device of claim 1, further comprising:
   a first portion of a silicide layer is formed on the first silicon-germanium layer;
   wherein, in the cross-sectional configuration, the first portion of the silicide layer electrically connects the first contact plug and the first silicon-germanium layer.

5. The semiconductor device of claim 2, further comprising:

a first portion of a silicide layer is formed on the first silicon-germanium layer;

wherein, in the cross-sectional configuration, the first portion of the silicide layer electrically connects the first contact plug and the first silicon-germanium layer.

6. The semiconductor device of claim 5, wherein the silicide layer is comprised of nickel.

7. The semiconductor device of claim 6, wherein the first contact plug does not contact the second sidewall.

8. The semiconductor device of claim 5, wherein the first contact plug does not contact the second sidewall.

9. The semiconductor device of claim 4, wherein, in the cross-sectional configuration, at least a portion of the first portion of the silicide layer protrudes above the top surface of the semiconductor substrate.

10. The semiconductor device of claim 9, wherein the silicide layer is comprised of nickel.

11. The semiconductor device of claim 10, wherein the first contact plug does not contact the second sidewall.

12. The semiconductor device of claim 9, wherein the first contact plug does not contact the second sidewall.

13. The semiconductor device of claim 4, wherein the silicide layer is comprised of nickel.

14. The semiconductor device of claim 13, wherein the first contact plug does not contact the second sidewall.

15. The semiconductor device of claim 4, wherein the first contact plug does not contact the second sidewall.

16. The semiconductor device of claim 1, wherein the first contact plug does not contact the second sidewall.

17. The semiconductor device of claim 1, wherein, in the cross-sectional configuration, the gate interconnect is formed entirely on the active region.

18. The semiconductor device of claim 1, wherein the first silicon-germanium layer is an epitaxial layer.

19. The semiconductor device of claim 1, wherein:
the gate interconnect has a long axis extending along the semiconductor substrate in a direction perpendicular to the gate length direction;
a first portion of the first sidewall extends under the entire first contact plug in the direction of the long axis of the gate interconnect; and
the first portion of the first sidewall is continuous in the direction of the long axis of the gate interconnect.

20. A semiconductor device comprising:
a gate electrode formed on an active region of a semiconductor substrate;
a first silicon-germanium layer formed in a first depression provided in a portion of the active region;
the first silicon-germanium layer comprised of silicon and germanium;
a gate interconnect formed at a position opposite to the gate electrode with respect to the first depression;
a first contact plug comprised of tungsten;
a first sidewall formed on the side face of the gate interconnect closer to the first depression;
a second sidewall formed on the other side face of the gate interconnect;
the bottom surface of the first contact plug is not lower than the bottom surface of the first sidewall and the bottom surface of the first contact plug is not lower than the bottom surface of the second sidewall;

wherein, in a cross-sectional configuration, the first sidewall is lower in height than the second sidewall, and the first contact plug is electrically connected to the first silicon-germanium layer and the gate interconnect.

21. The semiconductor device of claim 20, wherein, in the cross-sectional configuration, at least a portion of the first silicon-germanium layer protrudes above the top surface of the semiconductor substrate.

22. The semiconductor device of claim 21, further comprising:
a first portion of a silicide layer is formed on the first silicon-germanium layer;
wherein, in the cross-sectional configuration, the first portion of the silicide layer electrically connects the first contact plug and the first silicon-germanium layer.

23. The semiconductor device of claim 22, wherein the silicide layer is comprised of nickel.

24. The semiconductor device of claim 23, wherein the first contact plug does not contact the second sidewall.

25. The semiconductor device of claim 22, wherein the first contact plug does not contact the second sidewall.

26. The semiconductor device of claim 21, wherein the first contact plug does not contact the second sidewall.

27. The semiconductor device of claim 20, further comprising:
a first portion of a silicide layer is formed on the first silicon-germanium layer;
wherein, in the cross-sectional configuration, the first portion of the silicide layer electrically connects the first contact plug and the first silicon-germanium layer.

28. The semiconductor device of claim 27, wherein, in the cross-sectional configuration, at least a portion of the first portion of the silicide layer protrudes above the top surface of the semiconductor substrate.

29. The semiconductor device of claim 28, wherein the silicide layer is comprised of nickel.

30. The semiconductor device of claim 29, wherein the first contact plug does not contact the second sidewall.

31. The semiconductor device of claim 28, wherein the first contact plug does not contact the second sidewall.

32. The semiconductor device of claim 27, wherein the silicide layer is comprised of nickel.

33. The semiconductor device of claim 32, wherein the first contact plug does not contact the second sidewall.

34. The semiconductor device of claim 27, wherein the first contact plug does not contact the second sidewall.

35. The semiconductor device of claim 20, wherein the first contact plug does not contact the second sidewall.

36. The semiconductor device of claim 20, wherein the first silicon-germanium layer is an epitaxial layer.

37. The semiconductor device of claim 20, wherein:
the gate interconnect has a long axis extending along the semiconductor substrate in a direction perpendicular to the gate length direction;
a first portion of the first sidewall extends under the entire first contact plug in the direction of the long axis of the gate interconnect; and
the first portion of the first sidewall is continuous in the direction of the long axis of the gate interconnect.

* * * * *